United States Patent [19]

Hopkins

[11] 4,445,736
[45] May 1, 1984

[54] METHOD AND APPARATUS FOR PRODUCING A PREMOLDED PACKAGING

[75] Inventor: John R. Hopkins, Cambridge, Md.

[73] Assignee: AMP Incorporated, Harrisburg, Pa.

[21] Appl. No.: 364,165

[22] Filed: Mar. 31, 1982

[51] Int. Cl.³ .................. H05K 1/00; H01R 43/00
[52] U.S. Cl. ........................... 339/17 CF; 29/827; 29/883; 174/52 FP
[58] Field of Search ............. 29/827, 841, 848, 883, 29/884; 174/52 FP; 339/17 CF, 176 MP; 361/401

[56] References Cited

U.S. PATENT DOCUMENTS

| | | | |
|---|---|---|---|
| 3,287,795 | 11/1966 | Chambers | 361/401 X |
| 3,389,461 | 6/1968 | Hardardt | 29/848 |
| 3,574,929 | 4/1971 | Michik | 29/884 X |
| 3,693,239 | 9/1972 | Dix | 29/841 X |
| 3,798,763 | 3/1974 | Deltoer | 29/883 X |
| 4,079,511 | 3/1978 | Grabbe | 29/827 |
| 4,142,287 | 3/1979 | Grabbe . | |
| 4,195,193 | 3/1980 | Grabbe et al. . | |
| 4,197,636 | 4/1980 | Osanai | 29/883 X |
| 4,225,209 | 9/1980 | Hughes | 339/176 MP X |
| 4,337,574 | 7/1982 | Hughes et al. | 29/883 |
| 4,395,084 | 7/1983 | Conrad | 29/884 X |

FOREIGN PATENT DOCUMENTS

| | | | |
|---|---|---|---|
| 1528075 | 4/1968 | France | 174/52 FP |
| 47-11863 | of 1972 | Japan | 29/884 |

Primary Examiner—Howard N. Goldberg
Assistant Examiner—Carl J. Arbes
Attorney, Agent, or Firm—Russell J. Egan

[57] ABSTRACT

A method is disclosed for forming a package for leadless integrated circuit substrates. Two identical webs of conductive material are formed into ladder like arrays of parallel terminals. One web has first housing portions formed on opposite ends of the terminals which are then formed on the housing portions. The second web is placed overlying the first web and between the first housing portions and second housing portions molded thereon integral with the first housing portions. The second terminals are then formed to finish the package.

4 Claims, 14 Drawing Figures

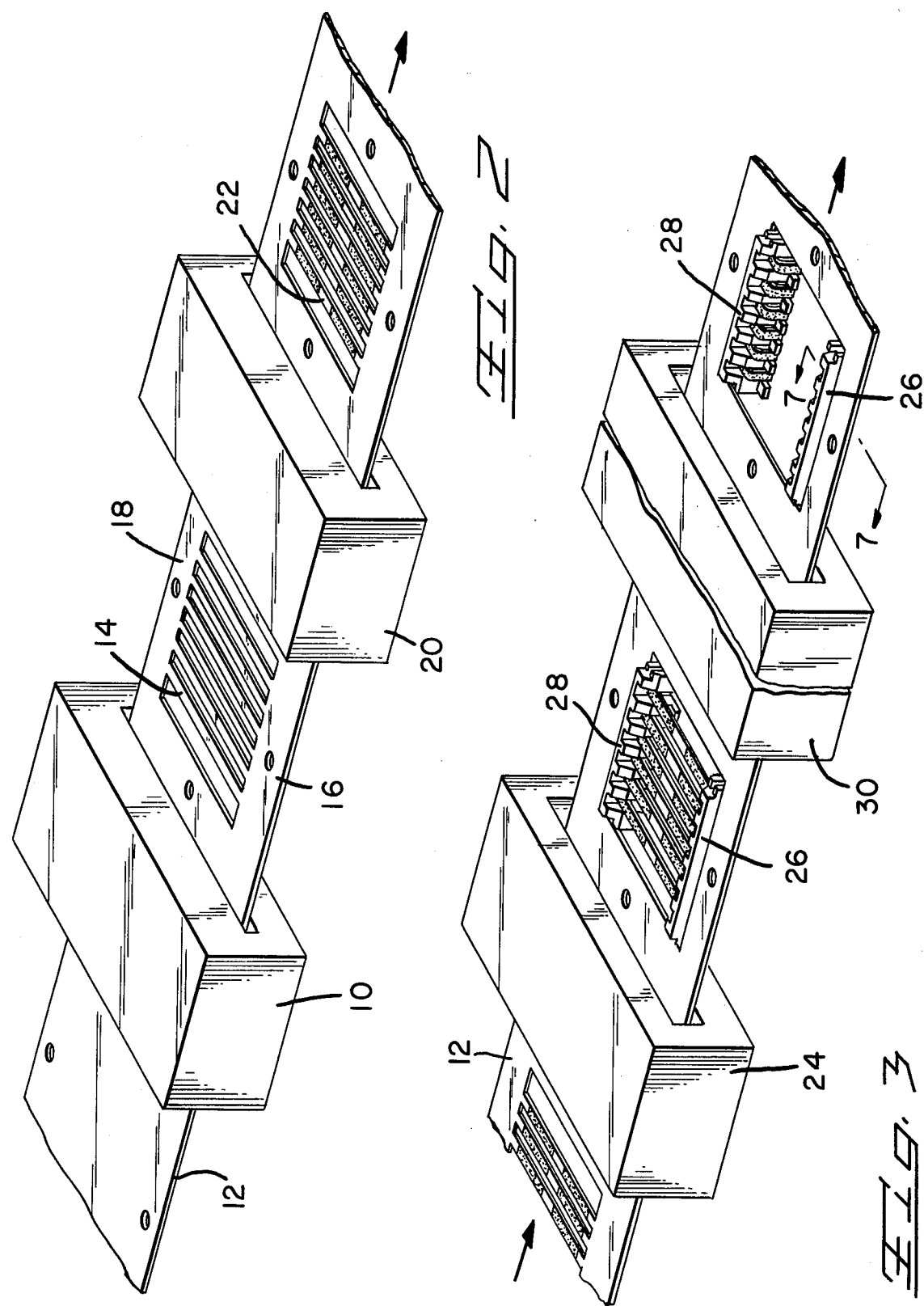

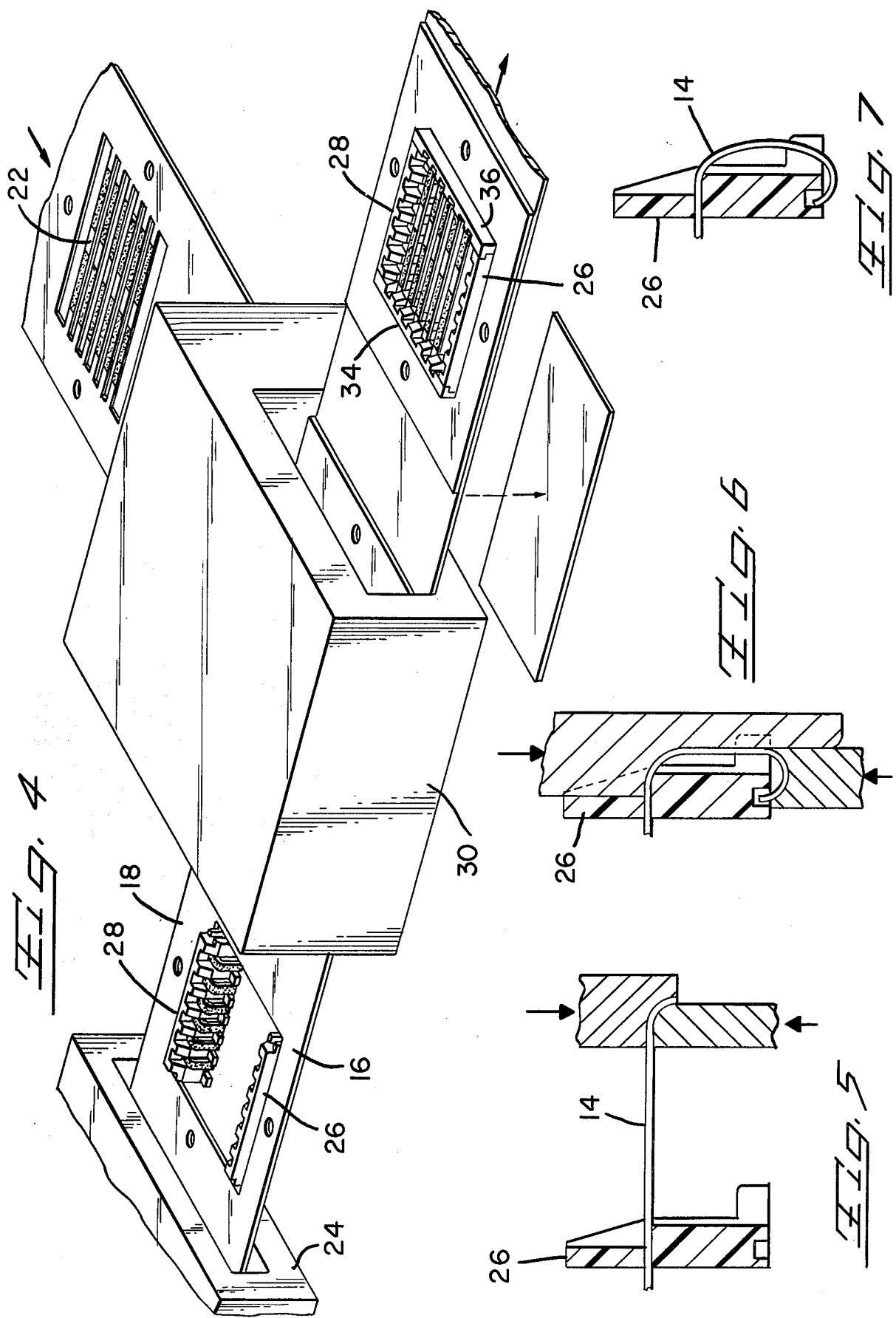

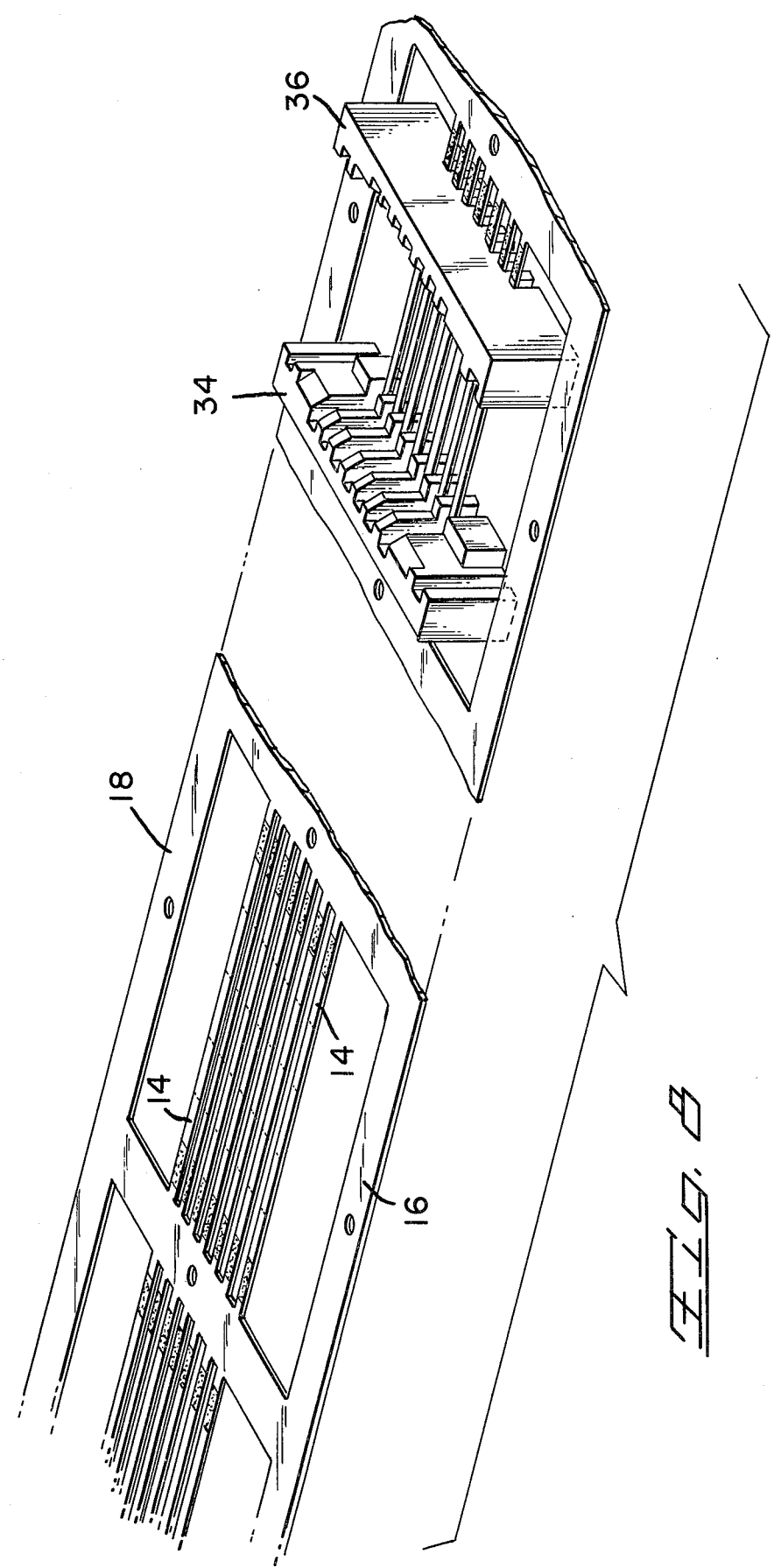

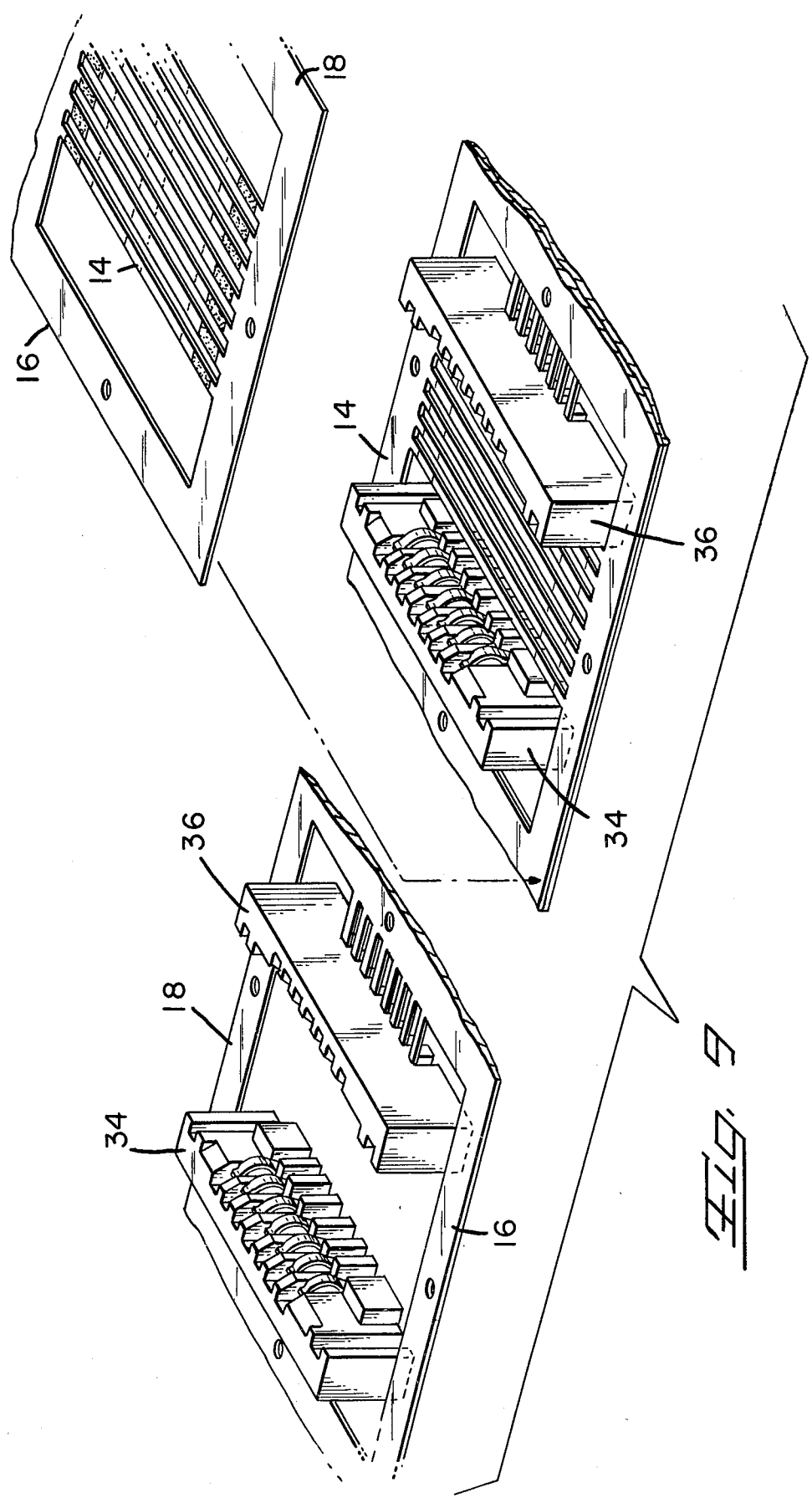

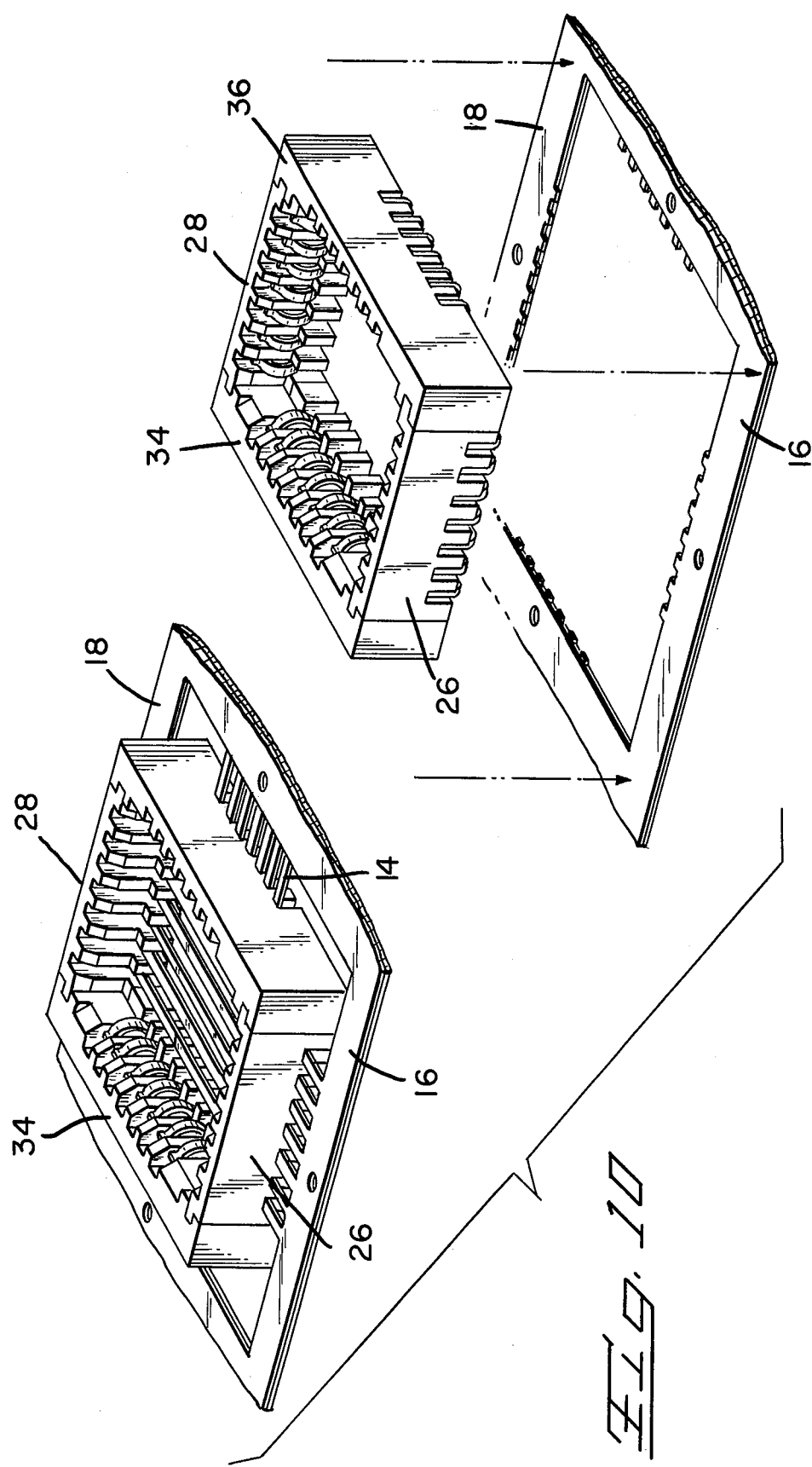

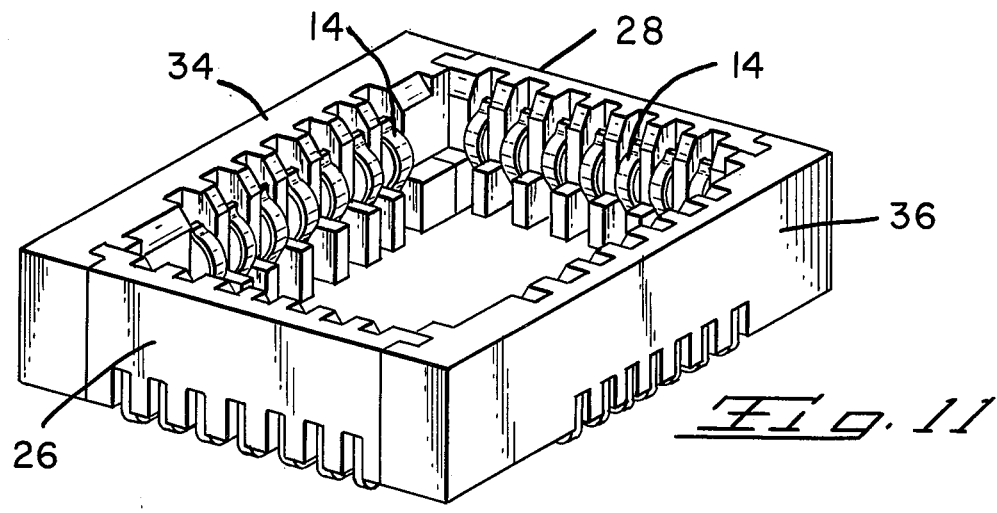
_Fig. 11_
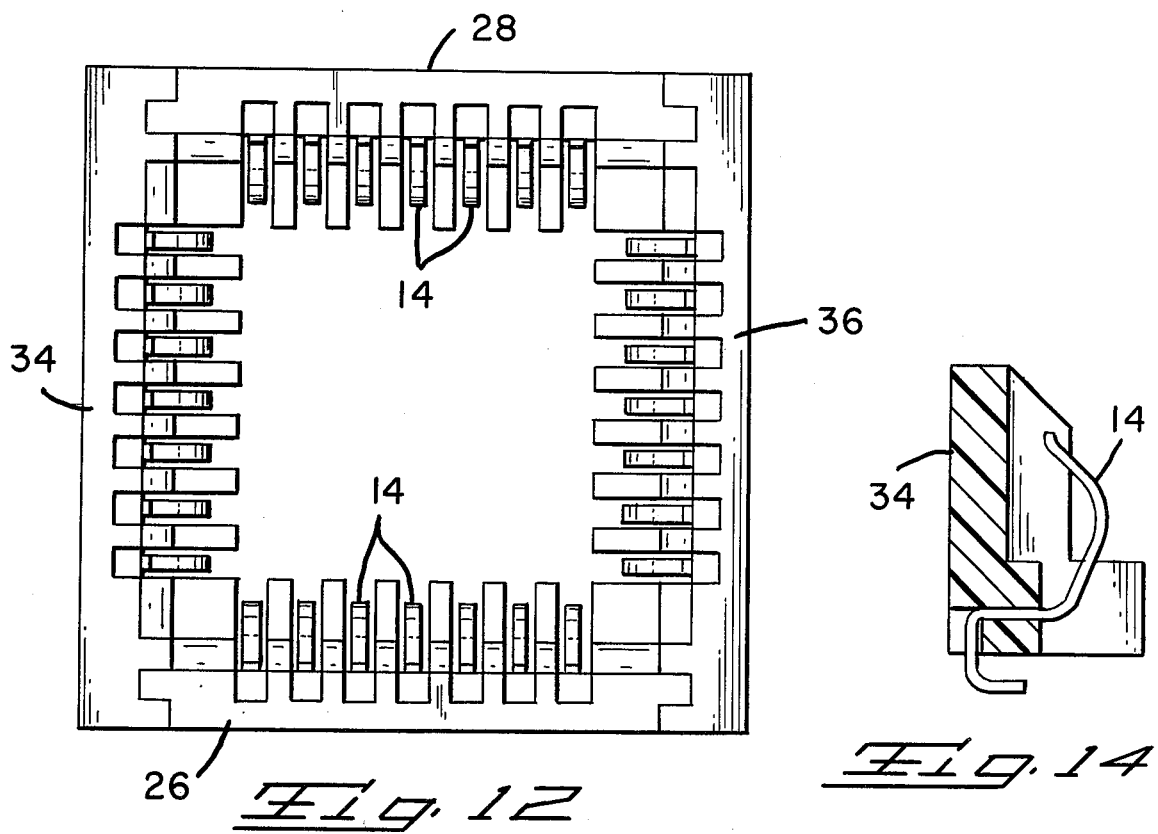
_Fig. 12_
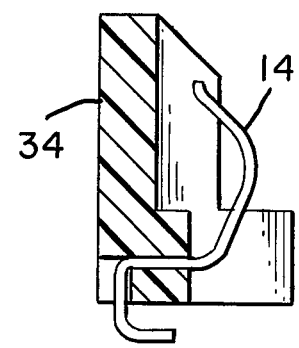
_Fig. 14_
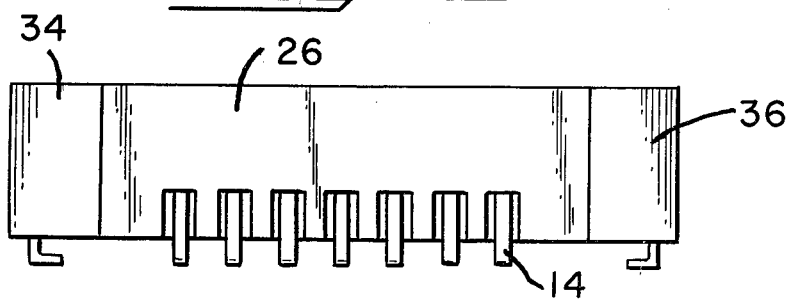
_Fig. 13_

METHOD AND APPARATUS FOR PRODUCING A PREMOLDED PACKAGING

The present invention relates to a method and apparatus for the formation of premolded packages to receive integrated circuit chips therein, also known as leadless substrates, and in particular to a method and apparatus which overcomes many of the difficulties of the prior art.

In the past there have been a notable number of attempts to form premolded packages, many of which have failed due to excessive costs or inadequate performance of the resulting product. All of these generally attempted to form a plurality of terminals on a single web of conductive material and then mold a housing on the resulting array of terminals. The terminals were subsequently separated from the web and formed on the housing. This caused great difficulties because of the relative small size and high density of the terminals which could be easily offset in a molding operation to be improperly located for final use. An example of the prior art can be found in U.S. Pat. No. 4,195,193 with an example of the complexity of a terminal array being found in FIG. 5 of U.S. Pat. No. 4,412,287.

The present invention overcomes many of the difficulties of the noted prior art by providing a multi-step process for forming the subject package. The present invention includes the step of stamping and forming first and second webs of conductive material to form arrays of parallel spaced terminals. Each web can then be selectively plated, as desired, with material of the desired type and thickness at the proper locations. One of the webs is then subjected to a first molding operation in which first portions of the packaged frame are molded to opposite ends of the terminals. The thus formed partial package is then subjected to a cutting and forming operation which separates intermediate their ends and forms the terminals about the partial package. The second web of terminals is placed in an overlying position between the partial package extending transversely to the first web and in contact therewith. The partial package is next passed through a second molding operation which forms second portions of the package at opposite ends of the terminals of the second web while integrally joining the first package portions. The thus formed package is then passed to a second cutting and forming operation which forms the second terminals with respect to the package and separates the package from the carrier webs. The thus formed package can then be inspected, packaged, and shipped.

The present invention will be described in an illustrative example with reference to the accompanying drawings in which:

FIG. 2 is a schematic diagram of the stamping and plating operations forming each of the conductive webs utilized in the present invention;

FIG. 3 is a schematic diagram of the first molding station and first forming station of the present invention;

FIG. 4 is a schematic diagram of the second molding station;

FIGS. 5 to 7 are transverse sections through a portion of the subject package showing the steps in forming a representative terminal;

FIG. 8 is a perspective view of the first web according to the present invention with the first portion of the housing molded thereon;

FIG. 9 is a perspective view of the partial package as it would appear at the station with the second web overlying the first and ready for the second molding operation;

FIG. 10 is a perspective view of the fully molded package according to the present invention as it is separated from the carrier webs;

FIG. 11 is a perspective view of a package according to the present invention;

FIG. 12 is a top plan view of the package according to the subject invention;

FIG. 13 is a side elevation of the package according to the present invention; and FIG. 14 is a transverse section through one wall of the package showing a typical terminal configuration.

Figure 1:
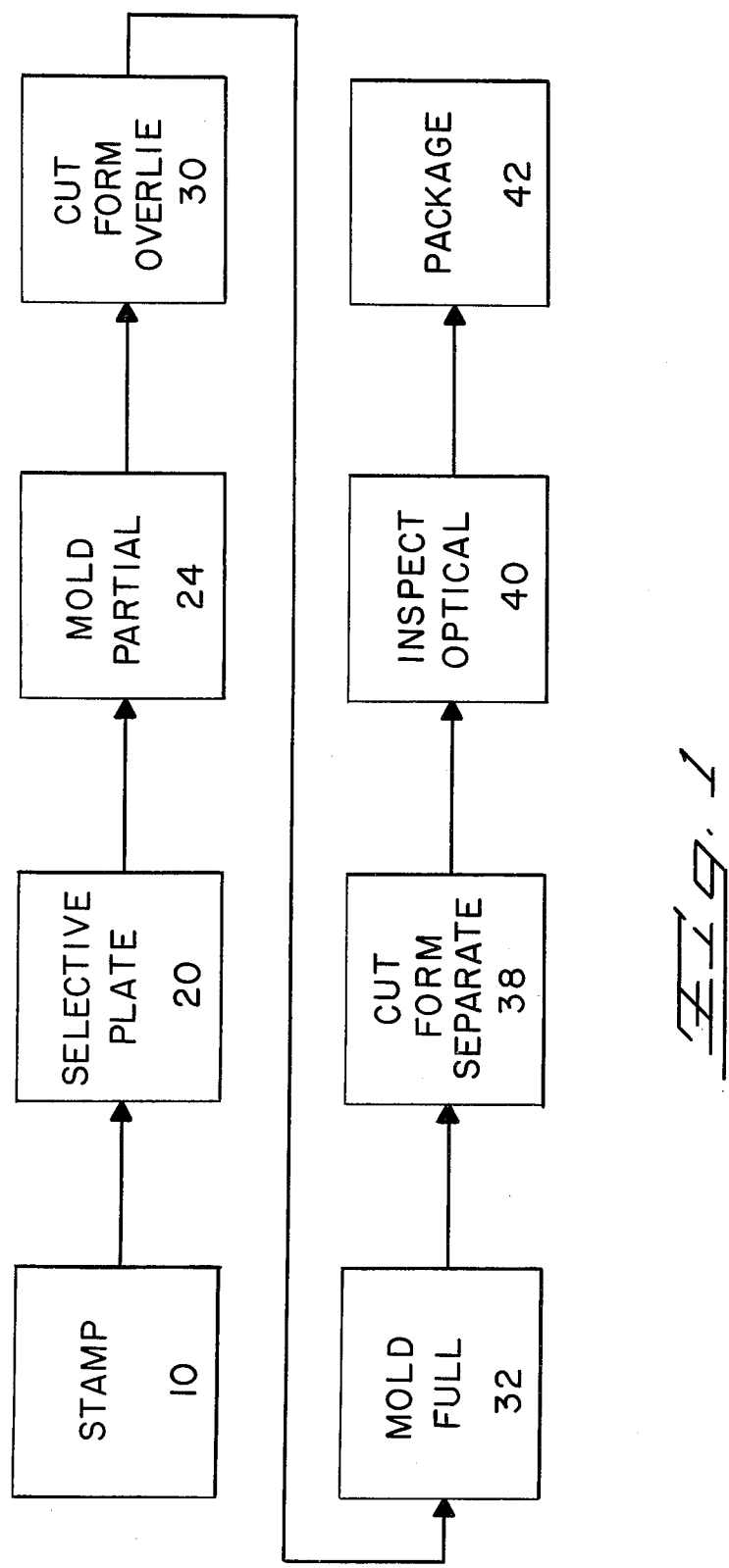
FIG. 1 is a schematic diagram of the steps of the present invention.

The subject invention is shown in an overall block level schematic in FIG. 1. The subject invention starts with a pair of continuous webs of conductive material, each of which passes through a stamping operation 10 to form a ladder-like array of a plurality of spaced apart terminals 14 extending transversely across the web 12 and joined at both ends by the continuous carrier portion 16, 18. Each of the thus formed webs can then pass to a selective plating operation 20 where plating 22, of the desired type and thickness, is applied to the terminals at the desired location. Thus far both webs have been treated in identical fashion. One web is now selected and passed to a first molding operation 24, as shown in FIGS. 3 and 8, with first housing portions 26, 28 being molded integrally to opposite ends of the first terminals 14. The thus formed partial package moves to the next station 30 where the terminals are cut substantially centrally of their ends and formed about the housing as shown in FIGS. 5 through 7. The partial package is now in the condition shown in FIGS. 3 and 9. The second web is brought into overlying transverse relationship, as shown in FIG. 9. The partial package is then moved to full molding station 30, as shown in FIG. 4, where second housing portions 34, 36 are molded on the second terminals with the ends of the second housing portions integrally joining the first housing portions 26, 28. The package goes to a second cut and forming station 38 where the second terminals are cut substantially centrally of their ends and formed, as previously described. The completed package is separated from the carrier webs. The completed package can now be passed to an optical inspection station 40 and to a final packaging station 42 where they will be readied for shipment.

It will be noted from a comparison from FIG. 7 and FIG. 14, that two different terminal configurations have been illustrated to show the far ranging variety which can be achieved by the present invention. It should also be noted that for all steps of the molding operation the terminals are fully supported so that it would be very unlikely that there would be any relative shifting in position of the terminals which could result in an unusuable product. It should also be appreciated that the subject method can readily be changed to accommodate packages having different numbers of terminals.

What is claimed is:

1. A package for supporting and interconnecting integrated circuit chips of the leadless type, said package being formed by the steps of:

forming first and second webs of conductive material;

stamping said webs to form ladders of terminals in a high density array of parallel spaced apart terminals;

molding first package portions on opposite ends of said terminals of said first web;

cutting said terminals substantially centrally of the ends and forming them with respect to said first package portions;

overlying said second web of terminals transversely to said first web and between said first package portions;

molding second package portions on opposite ends of said terminals of said second web with said second package portions integrally joining said first portions;

cutting said second terminals substantially centrally of their ends and forming them with respect to said second package portions; and separating said package from said webs.

2. The package according to claim 1 wherein each said web is selectively plated.

3. A method for forming a package for leadless integrated circuit chips comprising the steps of:

forming first and second webs of terminals from conductive materials with the terminals being in the form of a plurality of parallel spaced terminals extending transversely across the web in a ladder like configuration joined at their ends by carrier strips;

forming a partial package in a first molding operation by molding first housing members at opposite ends of the terminals of said first web;

cutting the terminals of the first web substantially centrally of their ends and forming them with respect to said first housing members;

overlying said second web of terminals transversely with respect to said first web and between said first housing members;

molding second housing members on opposite ends of said second terminals and integrally joining said first housing portions;

cutting said terminals of said second web substantially centrally of their ends and forming them with respect to said second housing members; and cutting said formed package from said carrier strips.

4. A method according to claim 3 further comprising the step of selectively plating said terminals.

* * * * *